United States Patent
Inoue (10) Patent No.: US 10,234,679 B2
(45) Date of Patent: Mar. 19, 2019

(54) CAPACITIVE-LOAD DRIVER CIRCUIT AND OPTICAL SCANNER

(71) Applicant: MITSUMI ELECTRIC CO., LTD., Tokyo (JP)

(72) Inventor: Fumihiro Inoue, Tama (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 0 days.

(21) Appl. No.: 15/510,173

(22) PCT Filed: Aug. 31, 2015

(86) PCT No.: PCT/JP2015/074599
§ 371 (c)(1),
(2) Date: Mar. 9, 2017

(87) PCT Pub. No.: WO2016/043028
PCT Pub. Date: Mar. 24, 2016

(65) Prior Publication Data
US 2017/0255007 A1   Sep. 7, 2017

(30) Foreign Application Priority Data

Sep. 18, 2014 (JP) ................. 2014-189640

(51) Int. Cl.
*G02B 26/00* (2006.01)
*G02B 26/08* (2006.01)
(Continued)

(52) U.S. Cl.
CPC ....... *G02B 26/0858* (2013.01); *G02B 26/101* (2013.01); *G02B 26/105* (2013.01);
(Continued)

(58) Field of Classification Search
None
See application file for complete search history.

(56) References Cited

U.S. PATENT DOCUMENTS 5,828,354 A * 10/1998 Ebihara ............... G09G 3/20
345/58
6,181,031 B1   1/2001 Pidutti et al.
(Continued)

FOREIGN PATENT DOCUMENTS

DE     4239058.3 C1    1/1994
DE     19858250 A1     6/2000
(Continued)

OTHER PUBLICATIONS

International Search Report (ISR) and Written Opinion dated Nov. 10, 2015 issued in International Application No. PCT/JP2015/074599.

(Continued)

*Primary Examiner* — Henry Lee, III
(74) *Attorney, Agent, or Firm* — Holtz, Holtz & Volek PC (57) ABSTRACT

A capacitive-load driver circuit that is connected to terminals connected to capacitive loads and an output stage of an amplifier for feeding output voltages to the terminals to drive the capacitive loads. The capacitive-load driver circuit temporarily feeds a current during a transition period of the output voltages from one of the terminals transitioning from a high voltage state to a low voltage state to another terminal transitioning from a low voltage state to a high voltage state. The capacitive-load driver circuit includes a current-variation detector circuit and a charge transfer circuit. The current-variation detector circuit detects a variation in a current at the output stage. The charge transfer circuit feeds a predetermined current to one of the terminals to transfer charges from a capacitive load connected to a high voltage terminal to a capacitive load connected to a low voltage terminal.

8 Claims, 7 Drawing Sheets

(51) Int. Cl.
*G02B 26/10* (2006.01)
*G03B 21/00* (2006.01)
*H02N 2/00* (2006.01)
*H03K 17/687* (2006.01)
*H01L 41/04* (2006.01)

(52) U.S. Cl.
CPC .......... *G03B 21/008* (2013.01); *H01L 41/042* (2013.01); *H02N 2/001* (2013.01); *H03K 17/6871* (2013.01)

(56) References Cited

U.S. PATENT DOCUMENTS

| | | | |
|---|---|---|---|
| 6,600,483 | B1 | 7/2003 | Akita et al. |
| 2012/0062970 | A1 | 3/2012 | Yamada et al. |

FOREIGN PATENT DOCUMENTS

| | | | |
|---|---|---|---|
| JP | 59090424 | A | 5/1984 |
| JP | 04039060 | A | 2/1992 |
| JP | 2001244761 | A | 9/2001 |
| JP | 2010288435 | A | 12/2010 |
| JP | 4655584 | B2 | 3/2011 |
| JP | 2011160309 | A | 8/2011 |

OTHER PUBLICATIONS

International Preliminary Report on Patentability (IPRP) including an English translation of the Written Opinion of the International Searching Authority dated Mar. 21, 2017 issued in counterpart International Application No. PCT/JP2015/074599.

Extended European Search Report (EESR) dated Apr. 9, 2018 issued in counterpart European Application No. 15842816.9.

\* cited by examiner

CAPACITIVE-LOAD DRIVER CIRCUIT AND OPTICAL SCANNER

TECHNICAL FIELD

The present invention relates to a driver circuit driving capacitive loads, in particular, a technique that can be effectively applied to a driver circuit suitable for driving piezoelectric devices, for example, and an optical scanner including the driver circuit.

BACKGROUND ART

Optical apparatuses, such as digital cameras (image capturing apparatuses) and projectors, include actuators for controlling the orientations of their components, such as image capturing devices and mirrors. The driving mechanisms of the actuators are categorized into piezoelectric drive mechanisms, electromagnetic drive mechanisms, and electrostatic drive mechanisms. In particular, the piezoelectric drive mechanism is advantageous to high-speed operations and suitable for optical scanners for forming high-resolution images. An optical apparatus, such as a projector, typically includes a driver IC (semiconductor integrated circuit) including a MOS transistor for applying a drive voltage to a piezoelectric device or actuator.

Patent Document 1 discloses an image capturing apparatus that includes a piezoelectric device (electromechanical transducer) or actuator that is driven to control the orientation of an image capturing device. Patent Document 2 discloses an optical scanner that drives a piezoelectric device or actuator with a driver IC to control the orientation of a mirror.

PRIOR ART DOCUMENT

Patent Document

Patent Document 1: Japanese Patent Publication No. 4655584
Patent Document 2: Japanese Patent Application Laid-Open Publication No. 2010-288435
Patent Document 3: Japanese Patent Application Laid-Open Publication No. 2011-160309

SUMMARY OF INVENTION

Problem to be Solved by the Invention

Figure 9:
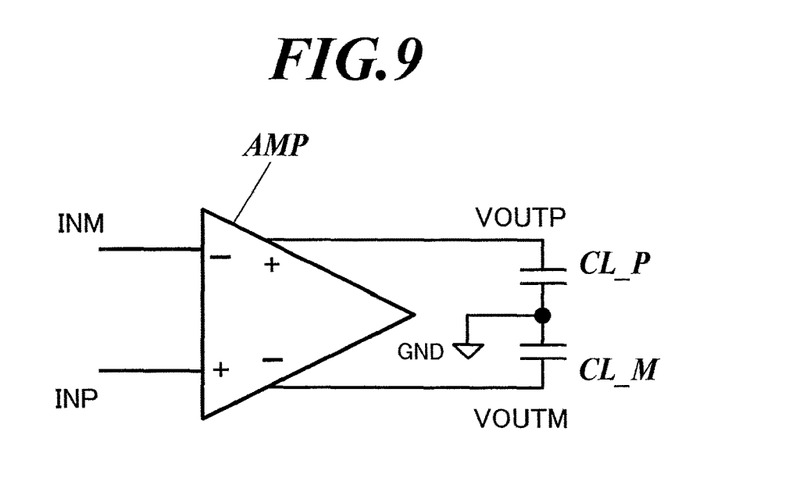
FIG. 9 is a circuit diagram illustrating an example of a traditional driver circuit that drives capacitive loads.

The piezoelectric drive mechanism is driven at a voltage higher than that in an electromagnetic drive mechanism and thus requires designs of a booster circuit and a driver circuit in consideration of power consumption and heat generation. In particular, a mirror of an optical scanner should have a certain deflection angle (an increase in maximum displacement) during drive of the mirror to provide a screen having predetermined dimensions. Thus, a high-power supply voltage from the booster circuit should be applied to the driver circuit to piezoelectrically drive the mirror. A traditional driver IC drives capacitive loads of piezoelectric devices. The electrical charges accumulated at an electric current from a power source for boosting the voltage to be applied to the capacitive loads are discharged to the ground during a decrease in the voltage to be applied to the capacitive loads. An example circuit driving capacitive loads, as illustrated in FIG. 9, includes a differential-output amplifier AMP that drives capacitive loads CL_M and CL_P. In also such a circuit, the electrical charges in the capacitive loads are fed to and consumed at the amplifier AMP during a decrease in the voltage applied to the capacitive loads. In detail, if the loads are regarded as capacitors, the capacitors do not consume electrical power but the differential amplifier or driver circuit consumes electrical power to vary the voltage to be applied to the capacitor. This hinders a reduction in electrical power consumption.

Patent Document 3 discloses a driver circuit for driving capacitive loads that has a small energy loss during charge and discharge of the capacitive loads due to shift of the positions of voltage application to the capacitive loads.

In the driver circuit disclosed in Patent Document 3 that sequentially applies a voltage to multiple electrodes disposed in parallel on the surface of a substrate, the charge in an electrode to which a voltage is applied is transferred to the next electrode to which a voltage is to be applied. This driver circuit has a load-drive mechanism different from that of a driver circuit of piezoelectric devices in an optical apparatus. The charge-transfer circuit includes a diode and an inductor. Current semiconductor manufacturing techniques cannot readily provide inductors in the form of small high-quality on-chip devices disposed on semiconductor substrates. Thus, the inductor cannot be readily provided in the form of a single driver IC.

A known technique for low power consumption is established through a driver circuit including a Class-D amplifier. A Class-D amplifier that drives piezoelectric devices or loads through pulse-width modulation should constantly switch the output stages of the amplifier at a high driving voltage of approximately 100V, for example. This relatively increases the switching loss in a light-load region, which is undesirable for low power consumption. A drawback of switching at high voltages is noticeable switching noise and ripples. Since filters for reducing them have large inductors and capacitors, they are forced to be connected to ICs, in the form of external devices. Class-D amplifiers are not suitable for driver circuits unless low power consumption is a significant advantage relative to the drawbacks involving cost and size.

An object of the present invention, which has been conceived under the circumstances described above, is to provide a driver circuit driving capacitive loads having low power consumption through regeneration of electrical power by transfer of the electrical charges in one capacitive load to which a voltage was applied to the next capacitive load. Another object is to provide a piezoelectrically driven optical scanner including a driver circuit driving capacitive loads that can provide a screen having predetermined dimensions with lower power consumption.

Means for Solving the Problem

To achieve the object described above, the present invention is a capacitive-load driver circuit that is connected to terminals connected to capacitive loads and an output stage of an amplifier for feeding output voltages to the terminals to drive the capacitive loads, the capacitive-load driver circuit temporarily feeding a current during a transition period of the output voltages from one of the terminals transitioning from a high voltage state to a low voltage state to another terminal transitioning from a low voltage state to a high voltage state, the capacitive-load driver circuit including:

a current-variation detector circuit that detects a variation in a current at the output stage; and a charge transfer circuit that feeds a predetermined current to one of the terminals to transfer charges from a capacitive load connected to a high voltage terminal to a capacitive load connected to a low voltage terminal, wherein the charge transfer circuit feeds the predetermined current to one of the terminals depending on a result detected at the current-variation detector circuit.

The capacitive-load driver circuit having the configuration described above includes a current-variation detector circuit that detects a variation in a current at an output stage and a charge transfer circuit that feed a predetermined current to one of the terminals depending on the result detected at the current-variation detector circuit. Thus, the electric power can be collected through transfer of the charges in one capacitive load to which a voltage was applied to the next capacitive load, to achieve low power consumption.

Preferably, the capacitive-load driver further includes:

a voltage comparator circuit that determines the magnitude relation of voltages at the terminals, wherein, the charge transfer circuit starts feeding the predetermined current to one of the terminals upon detection of a variation in the current at the output stage by the current-variation detector circuit, and the charge transfer circuit interrupts the current between the terminals upon detection of inversion of the magnitude relation of the voltages at the terminals by the voltage comparator circuit.

In this way, the charge transfer circuit can transfer the charges in one capacitive load to which a voltage was previously applied during a predetermined period to the next capacitive load.

Preferably, the capacitive-load driver circuit further includes:

a reference-current generator circuit that generates a reference current proportional to the current output from the output stage, wherein the charge transfer circuit feeds a current proportional to the reference current generated at the reference-current generator circuit to one of the terminals.

In this way, charges can be transferred between terminals in accordance with the rising and falling rate of the voltages required at the terminals connected to the loads.

Further, the amplifier includes a differential amplifier including a first output stage and a second output stage and has a differential output, the reference-current generator circuit includes:
a first current mirror circuit that feeds a current proportional to a current fed to the first output stage;
a second current mirror circuit that feeds a current proportional to a current fed to the second output stage;
a current selector that selects a current transferred at the first current mirror circuit or a current transferred at the second current mirror circuit; and
a third current mirror circuit that feeds the current selected at the current selector, and wherein
the reference-current generator circuit outputs a current transferred at the third current mirror circuit as the reference current.

In this way, the charges in one capacitive load to which a voltage was previously applied can be transferred to the next capacitive load in the circuit including a differential amplifier that drives the capacitive loads. This collects the electric power and reduces power consumption.

Preferably, the reference-current generator circuit includes:

a fourth current mirror circuit that feeds a current proportional to a bias current fed to the first output stage; and a fifth current mirror circuit that feeds a current proportional to a bias current fed to the second output stage, and the current selector selects a differential current between the current transferred at the first current mirror circuit and the current transferred at the fourth current mirror circuit or a differential current between the current transferred at the second current mirror circuit and the current transferred at the fifth current mirror circuit.

In this way, a reference current in consideration of a bias current fed to the output stage of the differential amplifier can be generated, and the charges can be transferred by feeding a current proportional to the reference current between terminals. Thus, the voltages at the terminals can be varied at a highly precise current regeneration rate.

Preferably, the current-variation detector circuit includes:

a sixth current mirror circuit that feeds a current proportional to a current fed to the first output stage;

a seventh current mirror circuit that feeds a current proportional to a current fed to the second output stage;

a first current-voltage converter that converts the current transferred at the sixth current mirror circuit to a voltage;

a second current-voltage converter that converts the current transferred at the seventh current mirror circuit to a voltage; and a determiner circuit that determines the direction of an output current based on the voltages converted at the first current-voltage converter and the second current-voltage converter, wherein the current selector selects a current based on the result determined at the determiner circuit.

In this way, the direction of the current output from the output stage of the amplifier, i.e., the terminal having an increasing voltage and the terminal having a decreasing voltage can be determined with a relatively simple circuit, and the transfer direction of charges can be determined based on the determined result.

Preferably, the charge transfer circuit includes:

a first transistor and a second transistor connected in series between a first terminal connected to a first capacitive load and a second terminal connected to a second capacitive load; and a third transistor that includes a control terminal connected to control terminals of the first and second transistors and receives the reference current.

In this way, the charge transfer circuit includes a small number of components. Thus, the area occupied by the circuit is small, and the chip can have reduced dimensions.

Another invention of the present application is an optical scanner including: alight source emitting light; a first piezoelectric device that tilts a first mirror reflecting the light from the light source around a first rotary shaft; a second piezoelectric device that tilts a second mirror reflecting the light reflected at the first mirror around a second rotary shaft; a first driver circuit that drives the first piezoelectric device; and a second driver circuit that drives the second piezoelectric device, wherein, the light reflected at the second mirror is scanned on the screen to form an image, and at least one of the first driver circuit and the second driver circuit includes the capacitive-load driver circuit described above.

In this way, a projector (optical scanner) that adjusts the angle of a reflective mirror with a piezoelectric device or actuator and scans light can achieve low power consumption.

Further, another invention of the present application is an optical scanner including: a light source emitting light; a first piezoelectric device that tilts a mirror reflecting the light from the light source around a first rotary shaft; a second piezoelectric device that tilts the mirror around a second rotary shaft; a first driver circuit that drives the first piezoelectric device in response to an image signal; and a second driver circuit that drives the second piezoelectric device in response to an image signal, wherein the light reflected at the mirror is scanned on a screen to form an image, and at least one of the first driver circuit and the second driver circuit includes the capacitive-load driver circuit described above.

In this way, a projector (optical scanner) that adjusts the angle of a reflective mirror with a piezoelectric device or actuator and scans light can achieve low power consumption.

Effects of the Invention

In a driver circuit that drives capacitive loads according to the present invention, charges in one capacitive load to which a voltage was previously applied can be transferred to the next capacitive load. A piezoelectrically driven optical scanner including capacitive-load driver circuits can provide a screen having predetermined dimensions at low power consumption.

DESCRIPTION OF PREFERRED EMBODIMENTS

Embodiments of the present invention will now be described with reference to the drawings.

Figure 1:
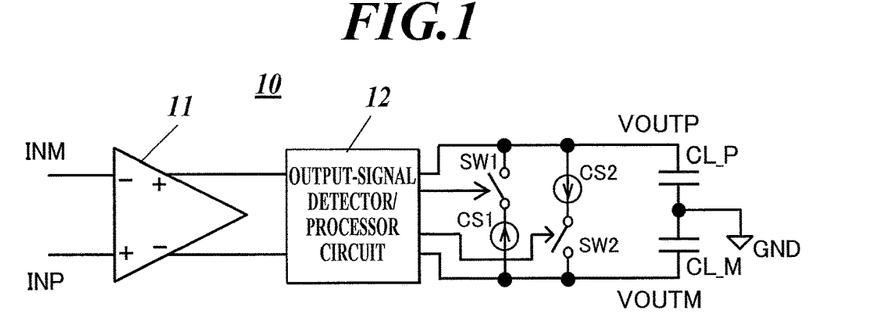
FIG. 1 is a circuit diagram illustrating a driver circuit that drives capacitive loads according to an embodiment of the present invention.

FIG. 1 is a circuit diagram illustrating the overall configuration of a driver circuit driving capacitive loads according to an embodiment of the present invention, a differential amplifier serving as the driver circuit.

A capacitive-load driver circuit (hereinafter, simply referred to as driver circuit) 10 according to this embodiment includes a differential amplifier 11 having a differential output; a constant-current source CS1 disposed between a terminal VOUTM connected to a capacitive load CL_M and a terminal VOUTP connected to a capacitive load CL_P and feeding a current from the terminal VOUTM to the terminal VOUTP; a current interruption switch SW1; a constant-current source CS2 feeding a current in the opposite direction from the terminal VOUTP to the terminal VOUTM; and a current interruption switch SW2.

The driver circuit 10 according to this embodiment includes an output-signal detector/processor circuit 12 that is connected to the differential output terminals of the differential amplifier 11 and the terminals VOUTM and VOUTP, that determines the magnitude relation of differential outputs from the differential amplifier 11 and detects variations in the currents output from the differential amplifier 11 to control the ON/OFF state of the switches SW1 and SW2. The driver circuit 10 according to this embodiment is a semiconductor integrated circuit disposed on a single semiconductor chip, such as a monocrystalline silicon chip, (hereinafter referred to as driver IC).

The differential amplifier 11 should not be limited to a differential input/differential output amplifier having two output stages. Alternatively, the differential amplifier 11 may consist of two single-end amplifiers. In a single-end amplifier (operational amplifier), an output voltage divided at a series resistance may be fed back to the input terminal of one of the single-end amplifiers. This allows the operational amplifier to control the output current such that the input signal follows the voltage multiplied by the gain.

The output-signal detector/processor circuit 12 usually outputs control signals for turning off the switches SW1 and SW2. Upon detection of a transition from a voltage state high at the terminal VOUTM and low at the terminal VOUTP (VOUTP<VOUTM) to a voltage state high at the terminal VOUTP and low at the terminal VOUTM (VOUTP>VOUTM), the output-signal detector/processor circuit 12 outputs a control signal for turning on the switch SW1. This causes the constant-current source CS1 to feed a current from the terminal VOUTM to the terminal VOUTP, and thus causes the electrical charges accumulated in the capacitive load CL_M to transfer to the capacitive load CL_P.

In the opposite manner, upon detection of a transition from a voltage state high at the terminal VOUTP and low at the terminal VOUTM (VOUTP>VOUTM) to a voltage state high at the terminal VOUTM and low at the terminal VOUTP (VOUTP<VOUTM), the output-signal detector/processor circuit 12 outputs a control signal for turning on the switch SW2. This causes the constant-current source CS2 to feed a current from the terminal VOUTP to the terminal VOUTM, and thus causes the electrical charges accumulated in the capacitive load CL_P to transfer to the capacitive load CL_M.

As described above, the driver circuit according to this embodiment functions as an inter-terminal charge-transfer unit that only operates during a variation in the terminal voltages at the output-signal detector/processor circuit 12 and the constant-current sources CS1 and CS2. Such an inter-terminal charge-transfer unit can reduce the electrical current unnecessarily fed from the power supply and consumed during a decrease in the voltage applied to the capacitive loads and achieve low power consumption of the driver circuit.

The output-signal detector/processor circuit 12 has a function (voltage comparator) of determining the magnitude relation of the voltages at the terminal VOUTP and the terminal VOUTM to detect the establishment of the conditions for transfer of charges between the terminals and a function of detecting a variation in the output of the differential amplifier 11. The function of detecting a variation in the output of the differential amplifier 11 is provided by a current detector circuit detecting whether the differential output of the differential amplifier 11 is a source current or a sink current.

The voltage comparator is provided in addition to the current detector circuit because transfer of charges (power collection) between differentially driven capacitive loads is limited from the capacitive load having a high and decreasing output voltage to the capacitive load having a low and increasing output voltage. In this embodiment, the current detector circuit detects a variation in the output currents (output voltages), which is the starting condition for the transfer of charges, and the voltage comparator detects the magnitude relation of the voltages at the terminals, which is the conditions for transfer of charges.

The current detector circuit is a unit determining the start timing of the transfer of charges, and the voltage comparator is a unit determining the stop timing of the transfer of charges.

The detailed configuration of the output-signal detector/processor circuit 12 will now be described.

Figure 3:
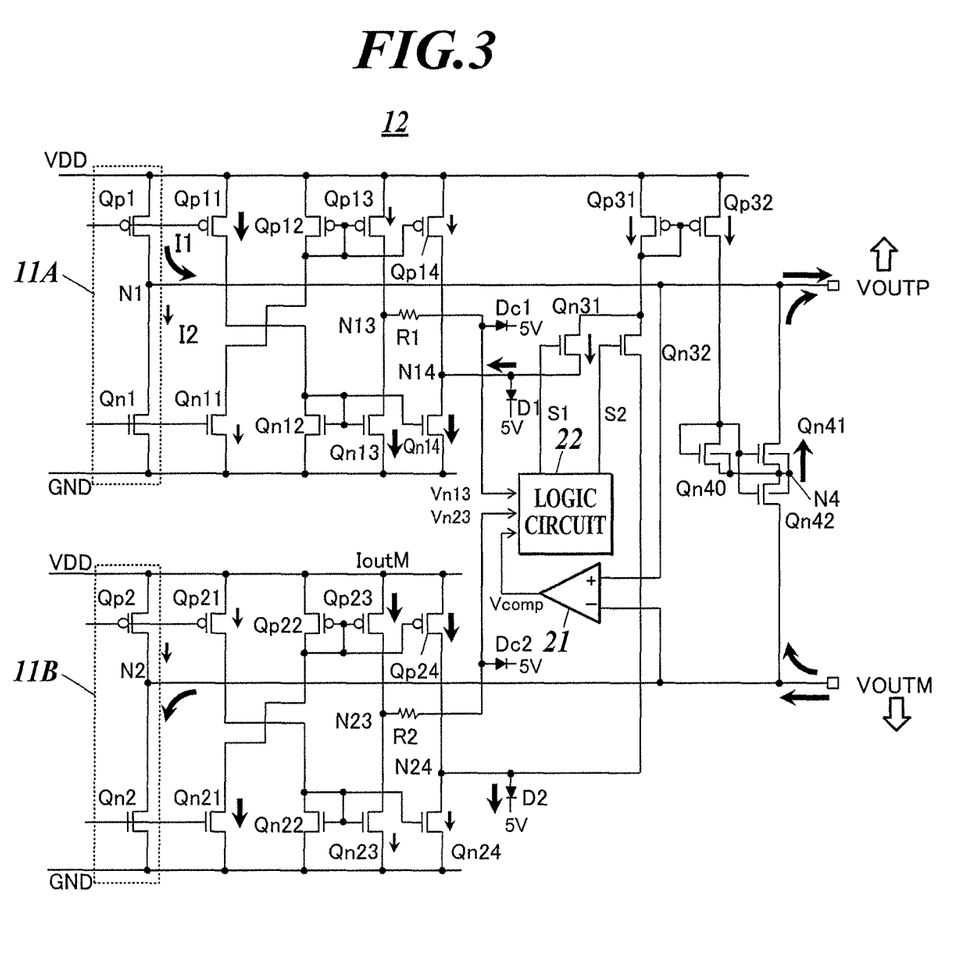
FIG. 3 is a circuit diagram illustrating an example capacitive-load driver circuit according to the present invention and the direction and magnitude relation of currents when the voltage at an output terminal VOUTP increases.

FIG. 3 illustrates an example output-signal detector/processor circuit 12. With reference to FIG. 3, a circuit 11A, which is one of the output stages of the differential amplifier 11, includes a P-channel MOS transistor Qp1 and an N-channel MOS transistor Qn1, connected in series between a supply voltage VDD and a ground potential GND. A circuit 11B, which is the other output stage of the differential amplifier 11, includes a P-channel MOS transistor Qp2 and an N-channel MOS transistor Qn2, connected in series between the supply voltage VDD and the ground potential GND. The supply voltage VDD is boosted at a booster circuit (not shown).

If the differential amplifier 11 in FIG. 1 consists of two single-end amplifiers, the circuit 11A including the transistors Qp1 and Qn1 serves as the output stages of one of the differential amplifier 11, and the circuit 11B including the transistor Qp2 and Qn2 serves as the output stage of the other differential amplifier 11.

A connection node N1 of the MOS transistors Qp1 and Qn1 of the output stage 11A is connected to the terminal VOUTP connected to the capacitive load CL_P. A connection node N2 of the MOS transistors Qp2 and Qn2 of the output stage 11B is connected to the terminal VOUTM connected to the capacitive load CL_M.

The output-signal detector/processor circuit 12 according to this embodiment includes a P-channel MOS transistor Qp11 that is connected in parallel with the P-channel MOS transistor Qp1 of the output stage 11A such that the same gate voltage is applied to the transistors Qp11 and Qp1 and defines a current mirror circuit together with the transistor Qp1; and an N-channel MOS transistor Qn11 that is connected in parallel with the N-channel MOS transistor Qn1 of the output stage 11A such that the same gate voltage is applied to the transistors Qn11 and Qn1 and defines a current mirror circuit together with the transistor Qn1. The ratio of the current mirror ratio of the transistors Qp1 and Qp11, which is defined by the W/L ratio of the gate width to the gate length or the transistors Qp1 and Qp11, to the current mirror ratio of the transistors Qn1 and Qn11 is determined to be 40:1, for example.

An N-channel MOS transistor Qn12 is connected in series between the drain terminal of the P-channel MOS transistor Qp11, which defines a current mirror circuit together with the transistor Qp1, and the ground potential GND. A P-channel MOS transistor Qp12 is connected in series between the drain terminal of the N-channel MOS transistor Qn11, which defines a current mirror circuit together with the transistor Qn1, and the supply voltage VDD. The W/L ratio of the transistor Qp12 is determined such that the W/L ratio of the transistor Qp1 to the W/L ratio of the transistor Qp12 (size ratio) is 40:1. The W/L ratio of the transistor Qn12 is determined such that the W/L ratio of the transistor Qn1 to the W/L ratio of the transistor Qn12 (size ratio) is 40:1.

The output-signal detector/processor circuit 12 includes a P-channel MOS transistor Qp13 that is disposed in parallel to the P-channel MOS transistor Qp12 and defines a current mirror circuit together with the transistor Qp12 through connection of the gate terminals of the transistors Qp13 and Qp12; and an N-channel MOS transistor Qn13 that is disposed in parallel to the N-channel MOS transistor Qn12 and defines a current mirror circuit together with the transistor Qn12 through connection of the gate terminals of the transistors Qn13 and Qn12.

The P-channel MOS transistor Qp13 and the N-channel MOS transistor Qn13 are connected in series between the supply voltage VDD and the ground potential GND. The ratio of the current mirror ratio of the transistors Qp12 and Qp13 to the current mirror ratio of the transistors Qn12 and Qn13 is determined to be 1:1, for example.

The output-signal detector/processor circuit 12 includes a P-channel MOS transistor Qp14 connected in parallel with the P-channel MOS transistor Qp12 such that the same gate voltage is applied to the transistors Qp14 and Qp12 and defines a current mirror circuit together with the transistor Qp12; and an N-channel MOS transistor Qn14 connected in parallel with the N-channel MOS transistor Qn12 such that the same gate voltage is applied to the transistors Qn14 and Qn12 and defines a current mirror circuit together with the transistor Qn12. The P-channel MOS transistor Qp14 and the N-channel MOS transistor Qn14 are connected in series between the supply voltage VDD and the ground potential GND. The ratio of the current mirror ratio of the transistors Qp12 and Qp14 to the current mirror ratio of the transistors Qn12 and Qn14 is determined to be 1:1, for example.

The output stage 11B of the differential amplifier includes MOS transistors Qp21 to Qp24 and Qn21 to Qn24, which have circuit configurations similar to those of the respective MOS transistors Qp11 to Qp14 and Qn11 to Qn14 provided downstream of the output stage 11A.

The output-signal detector/processor circuit 12 according to this embodiment includes a voltage comparator 21 that compares the voltages at the terminals VOUTP and VOUTM to be connected to the capacitive loads and determines the magnitude relation; and a logic circuit 22 that receives the output of the comparator 21, the potential Vn13 at a connection node N13 of the P-channel MOS transistor Qp13 and the N-channel MOS transistor Qn13, and the potential Vn23 at a connection node N23 of the P-channel MOS transistor Qp23 and an N-channel MOS transistor Qn23. The potential Vn13 at the connection node N13 and the potential Vn23 at the connection node N23 are input to the logic circuit 22 via resistors R1 and R2, respectively.

The output-signal detector/processor circuit 12 includes a P-channel MOS transistor Qp31 having a source terminal connected to the supply voltage VDD, an N-channel MOS transistor Qn31 connected between the drain terminal of the transistor Qp31 and the connection node N14 of the transistors Qp14 and Qn14, and an N-channel MOS transistor Qn32 connected between the drain terminal of the transistor Qp31 and the connection node N24 of the transistors Qp24 and Qn24. The output signals S1 and S2 of the logic circuit 22 are fed to the gate terminals of the transistors Qn31 and Qn32 to control their ON/OFF states with the output signals S1 and S2.

The output-signal detector/processor circuit 12 includes a P-channel MOS transistor Qp32 disposed in parallel with the P-channel MOS transistor Qp31 and defines a current mirror circuit together with the transistor Qp31 through connection of the gate terminals of the transistors Qp31 and Qp32; N-channel MOS transistors Qn41 and Qn42 connected in series between the terminals VOUTP and VOUTM to be connected to capacitive loads; and an N-channel MOS transistor Qn40 connected to the drain terminal of the transistor Qp32 and the connection node N4 of the transistors Qn41 and Qn42. The drain terminal and the gate terminal of the N-channel MOS transistor Qn40 are connected to each other, and the drain voltage of the transistor Qn40 is applied to the gate terminals of the MOS transistors Qn41 and Qn42 disposed in series.

The dimensions (W, L) of the P-channel MOS transistor Qp31 are determined to be 1/40 of that of the P-channel MOS transistor Qp1 of the output stage 11A. The transistor Qp32 defining a current mirror circuit together with the transistor Qp31 is determined to have dimensions such that the ratio of the current mirror ratio of the transistor Qp31 to the current mirror ratio of the transistor Qp32 is 1:10.

The dimensions of the transistors Qp11 to Qp14, Qn11 to Qn14, and Qp31 of the output-signal detector/processor circuit 12 are determined to be 1/40 of those of the transistors Qp1 and Qn1 of the output stage 11A, and the dimensions of the transistors Qp21 to Qp24 and Qn21 to Qn24 are determined to be 1/40 of those of the transistors Qp2 and Qn2 of the output stage 11B. This provides a relatively small current to be consumed at the output-signal detector/processor circuit 12.

In this embodiment, the dimensional ratios of the transistors Qn40 and Qn41 and the transistors Qn40 and Qn42 are each to be 1:40, and the dimensions of the transistor Qp31 is 1/40 of those of the transistor Qp1 and are to be determined such that the ratio of the current mirror ratio of the transistor Qp31 to the current mirror ratio of the transistor Qp32 is 1:10, as described above. Consequently, the transistors Qn41 and Qn42 receive currents having a value ten times larger than the currents fed to the output stage 11A and 11B (the transistors Qp1, Qn1; Qp2, Qn2).

Thus, the transistors Qn41 and Qn42 according to this embodiment receive currents having a value substantially the same as that of the current fed to the output stage of a traditional differential amplifier, and the capacitive load having the voltage boosted by the current is charged. As a result, the voltages at the terminals VOUTP and VOUTM can start up at a rate substantially the same as that of the voltage of a traditional differential amplifier.

In this embodiment, diodes Dc1 and Dc2 for clamping are connected to the lines connecting the resistors R1 and R2 and the logic circuit 22 and the lines connecting the nodes N14 and N24 and the transistors Qn31 and Qn32. The diodes Dc1 and Dc2 function as devices for limiting the electrical potential of the signal input to the logic circuit 22 to 5 V even at a supply voltage VDD higher than 5 V.

In this embodiment, the logic circuit 22 runs on a 5-V supply voltage.

Figure 5:
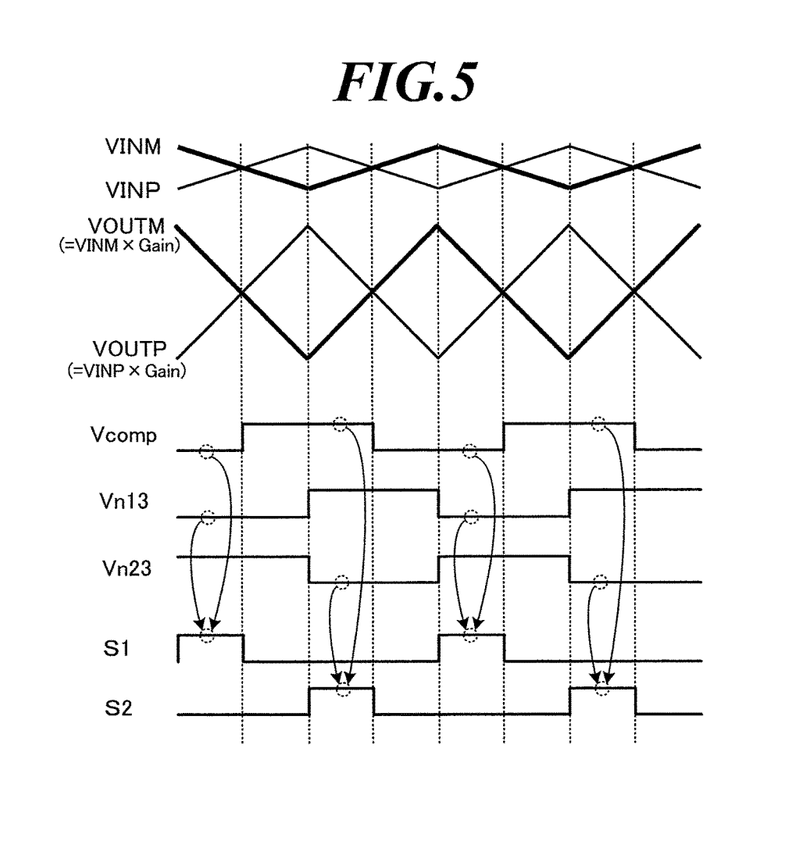
FIG. 5 is a timing chart illustrating the relation between variations in the voltage at terminals VOUTP and VOUTM of the driver circuit and variations in input and output signals at a logic circuit according to an embodiment illustrated in FIG. 3.

The signals input to the logic circuit 22 include a signal Vcomp output from the comparator 21, the potential Vn13 of the node N13, and the potential Vn23 of the node N23. The signals output from the logic circuit 22 include the ON/FF control signals S1 and S2 fed to the gates of the transistors Qn31 and Qn32. The potentials Vn13 and Vn23 of the respective nodes N13 and N23 are fed to the logic circuit 22 to determine by the logic circuit 22 whether the differential amplifier 11 is operating to generate a source current at the output stage 11A or a sink current at the output stage 11B, to determine whether to start up a voltage at the terminal VOUTP or VOUTM. FIG. 5 illustrates the relation between the logic levels of the signals Vcomp, Vn13, and Vn234 input to the logic circuit 22 and the signals S1 and S2 output from the logic circuit 22.

The logic circuit 22 includes logic gates, such as an AND gate, an OR gate, and an inverter. With reference to FIG. 5, if the comparator 21 compares the voltages at the terminals VOUTP and VOUTM and determines that the voltage at the terminal VOUTM is higher and the potential Vn13 at the node N13 is low, the ON/OFF control signal S1 to be fed to the gate of the transistor Qn31 increase to a high level, to turn on the transistor Qn31. If the comparator 21 determines that the voltage at the terminal VOUTP is higher and the potential Vn23 at the node N23 is low, the ON/OFF control signal S2 to be fed to the gate of the transistor Qn32 increase to a high level, to turn on the transistor Qn32.

Figure 6:
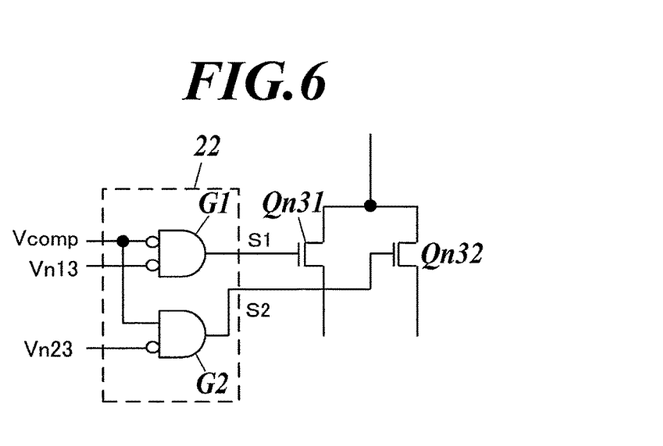
FIG. 6 is a circuit diagram illustrating an example logic circuit of the driver circuit according to an embodiment.

The logic circuit 22 may have any configuration that establishes the above-described relationship between the input signals Vcomp, Vn13, and Vn23 and the output signals S1 and S2. For example, the logic circuit 22 may have a relatively simple configuration including AND gates G1 and G2 having inverting input terminals, such as that illustrated in FIG. 6. The potential Vn13 at the node N13 is fed to one of the input terminals of the AND gate G1, the potential Vn23 at the node N23 is fed to one of the input terminals of the AND gate G2, and the signal Vcomp output from the comparator 21 is fed to the other terminals of the AND gates G1 and G2. The AND gate G1 can be defined as a NOR gate. A transmission gate including a MOS transistor serving as an analog switch may be provided in place of logic gates.

As described in the embodiment above, the comparator 21 functions as a circuit for determining whether to apply a current proportional to the ON/OFF states of the transistors Qn31 and Qn32 or the current output from either the output stage 11A or 11B, to the charge-transfer circuits (the transistors Qn40 to Qn42) to serve as a reference current during transfer of charges.

The operation of the output-signal detector/processor circuit 12 according to this embodiment will now be described.

Described below is an increase in voltage at the terminal VOUTP and a decrease in voltage at the terminal VOUTM due to a source current at the output stage 11A and a sink current at the output stage 11B in a voltage state high at the terminal VOUTM and low at the terminal VOUTP (VOUTP<VOUTM).

FIG. 3 illustrates arrows indicating the direction and magnitude relation of currents fed to the components of the circuit. The large arrows indicate large currents. In the output stage 11A, the current fed to the P-channel MOS transistor Qp1 increases and that fed to the N-channel MOS transistor Qn1 decreases. The current I1 fed to the transistor Qp1 is transferred at the current mirror circuit, and currents having a magnitude corresponding to the size ratio (I1/40) are fed to the transistors Qp11, Qn13, and Qn14. At this time, a relatively small bias current I2 is fed to the transistor Qn1 and transferred at the current mirror circuit, and a current having a magnitude corresponding to the size ratio (I2/40) is fed to the transistors Qn11, Qp13, and Qp14.

This feeds a current (I1/40) larger than the current (I2/40) fed to the transistor Qp13 to the transistor Qn13, and the potential VN13 at the node N13 decreases to the low-level ground potential. In the output stage 11B, the current fed to the P-channel MOS transistor Qp2 decreases, the current fed to the N-channel MOS transistor Qn2 increases, the currents fed to the transistors Qp2 and Qn2 are transferred at the current mirror circuit, and currents having magnitudes corresponding to the size ratio (1/40) are fed to the transistors Qp21, Qn23 and Qn24 and the transistors Qn11, Qp13, and Qp14. This increases the potential V23 at the node N23 to a high-level 5-V voltage such as that at the diode Dc2 for clamping.

As a result, the logic circuit 22 detects a source current at the output stage 11A and a sink current at the output stage 11B and turns on the MOS transistor Qn31 for selection in accordance with the output state (low level) of the comparator 21.

The differential currents fed to the transistors Qp24 and Qn24 are discharged through the diode D2 connected to the node N:24. The cathode terminal of the diode D2 is connected to the 5-V terminal to prevent insulation breakdown between the gate and source of the MOS transistor Qn32 for selection.

In the output-signal detector/processor circuit 12, an I1/40 current is fed to the transistor Qn14 and an I2/40 current is fed to the transistor Qp14, to feed a differential current (I1/40−I2/40) to the MOS transistor Qn31 for selection. This feeds a current precisely proportional to the current from the transistor Qp1 to the terminal VOUTP to the MOS transistor Qn31, and thus the reference current has high precision.

Although the transistors Qp11, Qn11, Qp12, and Qn12 can be omitted, if provided, these can reduce the noise generated due to switching. This is also stands for the transistors Qp21, Qn21, Qp22, and Qn22 in the output stage 11B.

Figure 4:
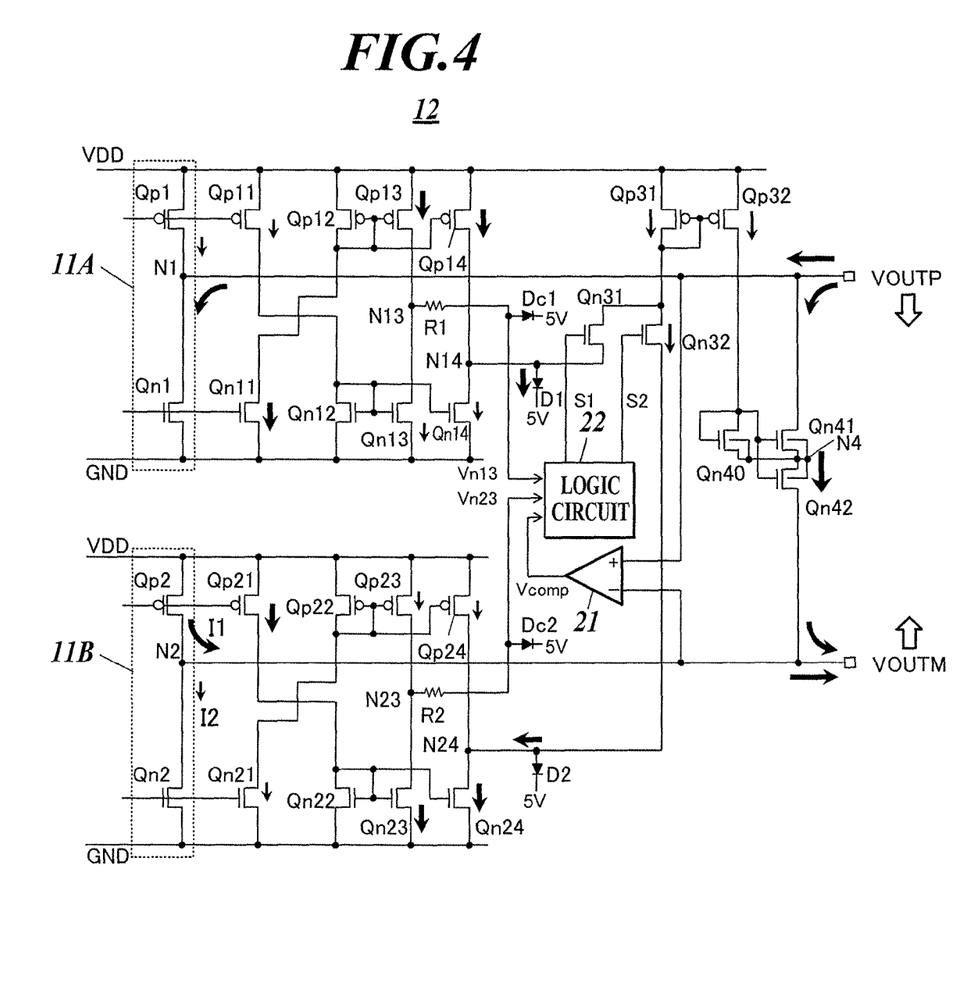
FIG. 4 is a circuit diagram illustrating the directions and magnitude relation of currents when the voltage at an output terminal VOUTM increases in the driver circuit in FIG. 3.

Described below is an increase in voltage at the terminal VOUTM and a decrease in voltage at the terminal VOUTP due to a sink current at the output stage 11A and a source current at the output stage 11B in a voltage state high at the terminal VOUTP and low at the terminal VOUTM (VOUTP>VOUTM).

FIG. 4 illustrates arrow indicating the direction and magnitude relation of currents fed to the components of the circuit. In the output stage 11A, the N-channel MOS transistor Qn1 is turned on, and the P-channel MOS transistor Qp1 is turned off. The current I2 fed to the transistor Qn1 is transferred at the current mirror circuit, and a current having a magnitude corresponding to the size ratio (I2/40) is fed to the transistors Qn11, Qp13, and Qp14. At this time, a relatively small bias current I1 is fed to the transistor Qp1 and transferred at the current mirror circuit, and a current having a magnitude corresponding to the size ratio (I1/40) is fed to the transistors Qp11, Qn13, and Qn14.

This feeds a current (I2/40) larger than the current (I1/40) fed to the transistor Qn13 to the transistor Qp13, and the potential VN13 at the node N13 increases to a high-level voltage, such as 5 V at the diode Dc1 for clamping. In the output stage 11B, the P-channel MOS transistor Qp2 is turned on, the N-channel MOS transistor Qn2 is turned off, the currents fed to the transistors Qp2 and Qn2 are transferred at the current mirror circuit, and currents having a magnitude corresponding to the size ratio (1/40) are fed to the transistors Qp21, Qn23, and Qn24 and the transistors Qn21, Qp23, and Qp24. This decreases the potential V23 at the node N23 to the ground potential (low level).

As a result, the logic circuit 22 detects a sink current at the output stage 11A and a source current at the output stage 11B and turns on the MOS transistor Qn32 for selection in accordance with the output state (high level) of the comparator 21.

The differential current fed to the transistors Qp14 and Qn14 are discharged through the diode D1 connected to the node N14.

In the output stage 11B, an I1/40 current is fed to the transistor Qp24 and an I2/40 current is fed to the transistor Qn24, to feed a differential current (I1/40−I2/40) to the MOS transistor Qn32 for selection. This feeds a current precisely proportional to the current from the transistor Qp2 to the terminal VOUTP to the MOS transistor Qn32, and thus the reference current has high precision.

Figure 2A:
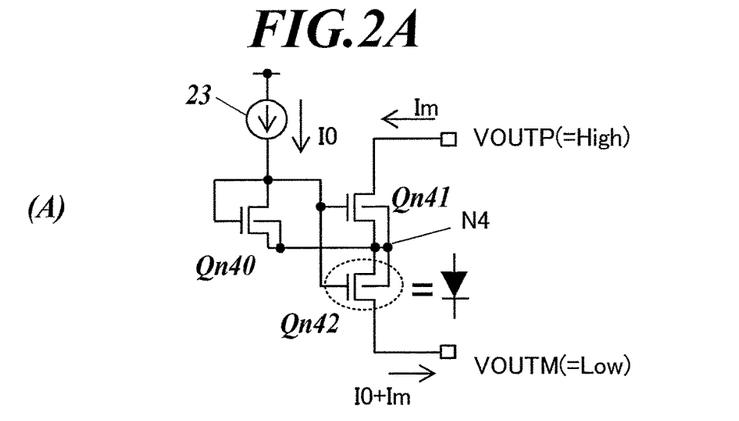
FIG. 2A is an equivalent circuit diagram illustrating the function of a charge transfer circuit of a driver circuit according to this embodiment and corresponding to the operational state in FIG. 4.
Figure 2B:
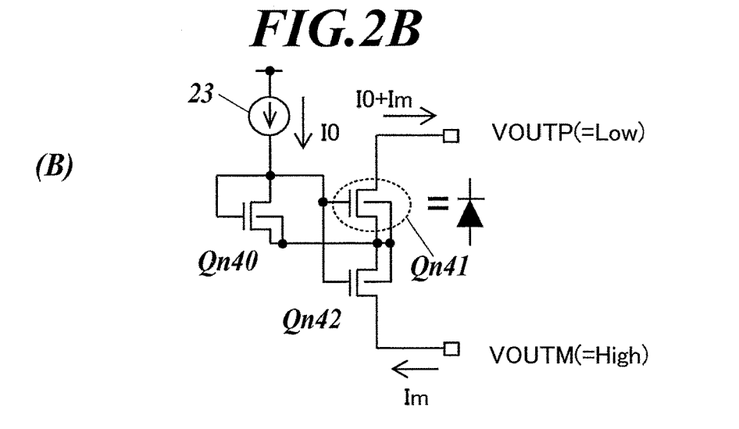
FIG. 2B is an equivalent circuit diagram illustrating the function of a charge transfer circuit of a driver circuit according to this embodiment and corresponding to the operational state in FIG. 3

The operation of the current-source circuit (transistors Qn40 to Qn42) for charge transfer will now be described with reference to FIG. 2. In FIG. 2, the constant-current source 23 feeding a reference current I0 corresponds to a current mirror circuit including the MOS transistors Qp31 and Qp32 in FIG. 3. FIG. 2A illustrates the operating state of FIG. 4, and FIG. 2B illustrates the operating state of FIG. 3.

In the case of an increase in the voltage at the terminal VOUTM and a decrease in the voltage at the terminal VOUTP, as described with reference to FIG. 4, the initial high voltage at the terminal VOUTP causes the MOS transistors Qn40 and Qn41 to operate as a current mirror circuit, as illustrated in FIG. 2A, to feed a current Im (=40×I0) proportional to the reference current I0 at the transistor Qn40 to the transistor Qn42. At the same time, the body diode of the transistor Qn42 functions as a forward diode, and a current having a magnitude of I0+Im is fed from the terminal VOUTP to the terminal VOUTM via the transistors Qn41 and Qn42.

This transfers charges from the capacitive load CL_P to the capacitive load CL_M, as illustrated in FIG. 1, and the reference current I0 can control the magnitude of the current Im during the transfer of charges.

Since I0 is sufficiently smaller than Im, I0+Im≈Im. When the voltage at the terminal VOUTM reaches the same as the voltage at the terminal VOUTP due to the transfer of charges, the output Vcomp from the comparator 21 is inverted, and the signals S1 and S2 are output from the logic circuit 22 to turn off the transistors Qn31 and Qn32, to interrupt the current Im.

In the case of an increase in the voltage at the terminal VOUTP and a decrease in the voltage at the terminal VOUTM, as described with reference to FIG. 3, the initial high voltage at the terminal VOUTM causes the MOS transistors Qn40 and Qn42 to operate as a current mirror circuit, as illustrated in FIG. 2B, to feed a current Im (=40×I0) proportional to the reference current I0 at the transistor Qn40 to the transistor Qn42. At the same time, the body diode of the transistor Qn41 functions as a forward diode, and a current having a magnitude of I0+Im is fed from the terminal VOUTM to the terminal VOUTP via the transistors Qn42 and Qn41.

This transfers charges from the capacitive load CL_M to the capacitive load CL_P, as illustrated in FIG. 1, and controls the magnitude of the current Im during the transfer of charges by the reference current I0. Thus, the current regeneration rate of the startup voltage at the terminal VOUTP can be controlled.

The capacitive-load driver circuit including the output-signal detector/processor circuit 12 according to this embodiment transfers the charges in one of the capacitive loads to the other capacitive load during an increase in voltage. Thus, power can be collected, significantly reducing power consumption compared to that of a traditional driver circuit. The inventors conducted calculation (simulation) and determined the power collection rate (power saving rate) to be approximately 40%.

(Modification)

Modifications of the embodiment will now be described with reference to FIGS. 7 and 8.

Figure 7:
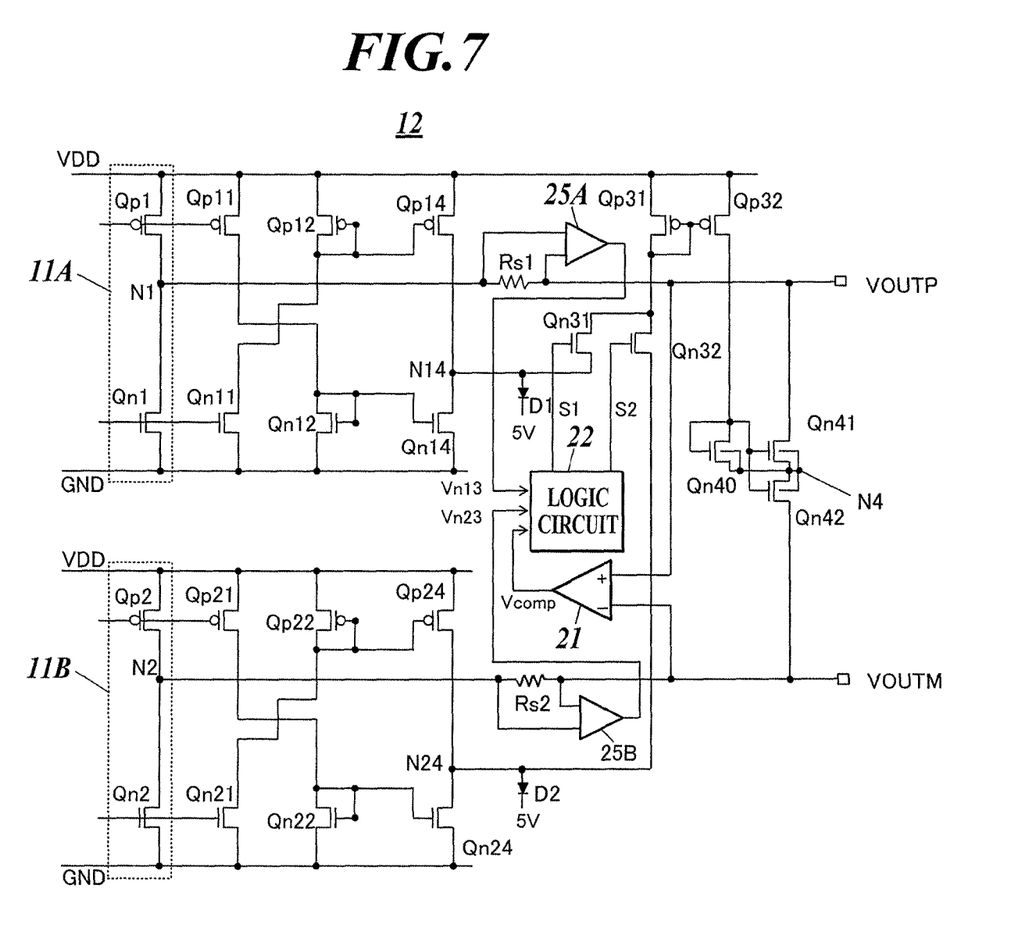
FIG. 7 is a circuit diagram illustrating a driver circuit according to a first modification of an embodiment.

A output-signal detector/processor circuit 12 according to a first modification includes a circuit for detecting a source current or a sink current at the output stages 11A and 11B, the circuit including sense resistors Rs1 and Rs2 for directly detecting currents and comparators 25A and 25B for comparing the voltages at the terminals of the resistors, as illustrated in FIG. 7. This configuration omits the transistors Qp13, Qn13, Qp23, and Qn23, the resistors R1 and R2, and the clamp diodes Dc1 and Dc2 illustrated in FIG. 3.

In place of the comparators 25A and 25B, an error amplifier may be provided that receives the voltages at the terminals of the sense resistors Rs1 and Rs2 to detect the magnitude of the currents and controls the gate terminals of the MOS transistors Qn31 and Qn32 with the output from the error amplifier, to generate a reference current based on the currents fed to the transistors Qn31 and Qn32 and proportional to the output currents. This configuration can omit the transistors Qp11, Qn11, Qp12, Qn12, Qp14, Qn14, Qp21, Qn21, Qp22, Qn22, Qp24, and Qn24 illustrated in FIG. 7.

Figure 8:
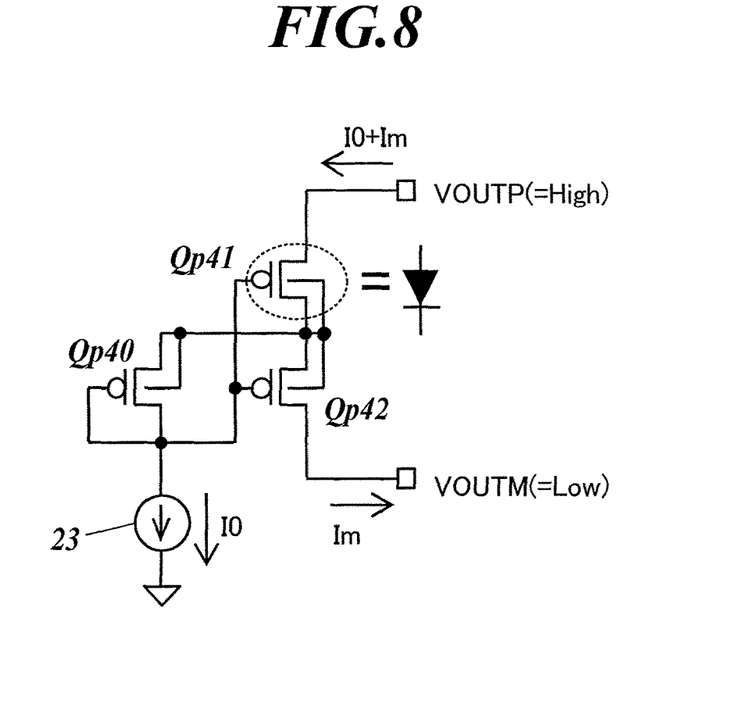
FIG. 8 is a circuit diagram illustrating the configuration of a charge-transfer circuit according to a second modification.

A output-signal detector/processor circuit 12 according to the second modification includes a charge-transfer circuit including P-channel MOS transistors Qp40 to Qp42, as illustrated in FIG. 8, in place of the charge-transfer circuit including the N-channel MOS transistors Qn40 to Qn42 illustrated in FIG. 3. The current source 23 (the transistors Qp31 and Qp32) feeding the reference current I0 may include N-channel MOS transistors, in place of the P-channel MOS transistors.

The reference current I0 may be generated on the basis of the load-driving current required by either the output stage having an increasing voltage or the output stage having a decreasing voltage.

A output-signal detector/processor circuit 12 according to the third modification, which omits the transistors Qp14 and Qp24 illustrated in FIG. 3, is suitable for use when the bias current fed to the output stages 11A and 11B is sufficiently smaller than the original output currents applied to increase or decrease the voltages at the terminals connected to the capacitive loads and the reference current has a precision within an allowable range even with a negligible bias current.

Although the precision of the reference current in this modification is lower than that of the circuit according to the embodiment illustrated in FIG. 3, this modification is advantageous in that the area occupied at the circuit is small due to a reduction in the number of components and the power consumed at the additional circuit is reduced.

Figure 10:
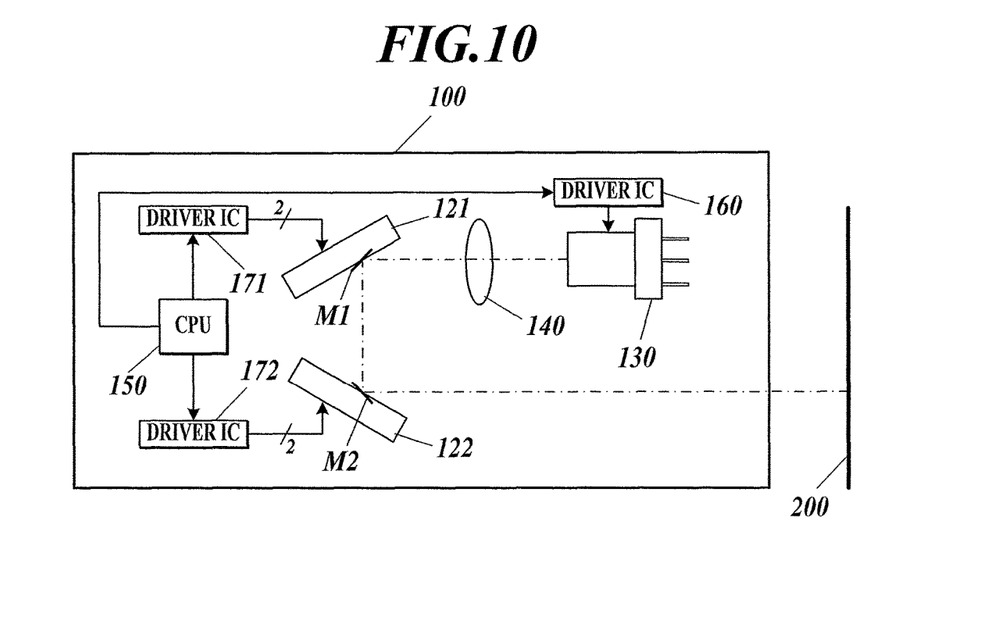
FIG. 10 is a block diagram illustrating the configuration of a projector (optical scanner) exemplifying a preferred system including the driver circuit driving capacitive loads according to the present invention.
Figure 11:
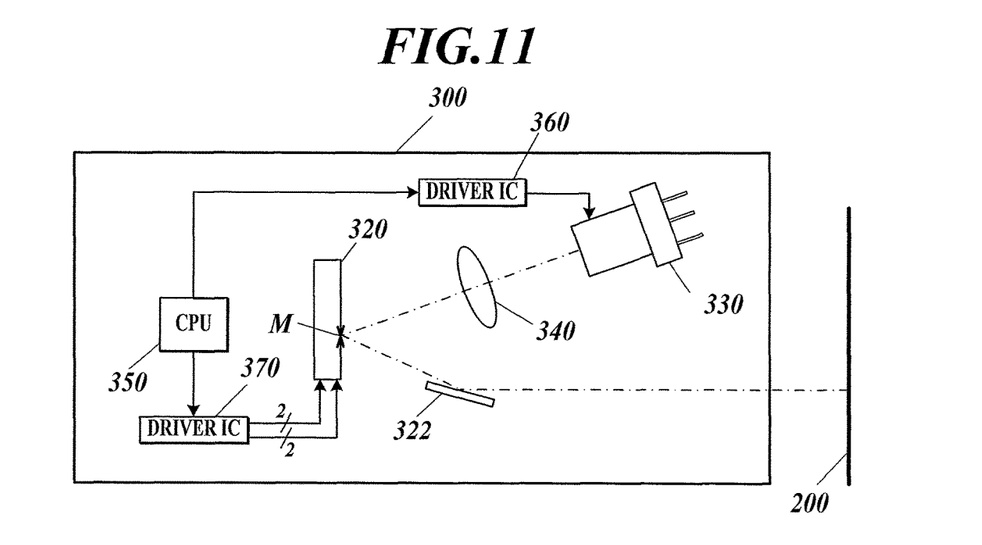
FIG. 11 is a block diagram illustrating the configuration of a projector (optical scanner) exemplifying another preferred system including the driver circuit driving capacitive loads according to the present invention.

FIGS. 10 and 11 illustrate the overall configuration of a projector exemplifying an optical scanner that is an application for the driver circuit according to an embodiment described above, in which the orientations of mirrors are controlled with piezoelectric devices or actuators driven with driver ICs.

With reference to FIG. 10, a projector 100 according to this embodiment includes a first piezoelectric mirror 121, a second piezoelectric mirror 122, a laser diode 130, a collimator lens 140, a CPU (central processing unit) 150, a driver IC (semiconductor integrated circuit) 160 for driving the laser diode, a driver IC 171 for driving the first piezoelectric mirror, and a driver IC 172 for driving the second piezoelectric mirror. The driver ICs 171 and 172 each include a differential amplifier 11 (single-end amplifiers) and an output-signal detector/processor circuit 12 according to the embodiment described above.

FIG. 10 illustrates a screen 200, which is an associated component. The projector 100 projects an image on the screen 200. The first piezoelectric mirror 121 serves as a monoaxially driven actuator that tilts a mirror component M1 around a rotary shaft X. The second piezoelectric mirror 122 serves as a monoaxially driven actuator that tilts a mirror component M2 around a rotary shaft Y.

The laser diode 130 is a light source that emits a laser beam. The laser beam emitted from the laser diode 130 may be diverging light.

The collimator lens 140 converts the diverging light into collimated light. The collimated light may include a P-polarized light component that oscillates within an incident plane of the light and/or an S-polarized light component that oscillates orthogonal to the incident plane.

The collimated light from the collimator lens 140 is incident on the first piezoelectric mirror 121 and is reflected at the mirror component M1. The first piezoelectric mirror 121 tilts the mirror component M1 around the rotary shaft X such that the reflected laser beam oscillates orthogonal to the rotary shaft X. The light reflected at the first piezoelectric mirror 121 is incident on the second piezoelectric mirror 122.

The second piezoelectric mirror 122 tilts the mirror component M2 around the rotary shaft Y to reflect the laser beam from the first piezoelectric mirror 121. This oscillates the reflected light orthogonal to the rotary shaft Y. The laser beam reflected at the second piezoelectric mirror 122 is incident on the screen 200. The laser beam on the screen 200 is biaxially scanned in orthogonal directions through a combination of the uniaxial first piezoelectric mirror 121 and the uniaxial second piezoelectric mirror 122, to form images.

The CPU 150 controls the laser driver IC 160 to drive the laser diode 130. The CPU 150 controls the first piezoelectric-mirror driver 171 in response to image signals input to the projector 100 to control the tilt of the first piezoelectric mirror 121 around the rotary shaft X, and controls the second piezoelectric-mirror driver 172 to control the tilt of the second piezoelectric mirror 122 around the rotary shaft Y.

The tilt of the first piezoelectric mirror 121 and the second piezoelectric mirror 122 shifts the laser beam around the rotary shafts X and Y, and the light reflected at the mirror component M2 of the second piezoelectric mirror 122 scans the screen 200, to project an image on the screen 200.

FIG. 11 illustrates the overall configuration of a projector 300 exemplifying an optical scanner including a biaxial piezoelectric mirror. The projector 300 according to this embodiment includes a biaxial piezoelectric mirror 320 including rotary shafts X and Y, a laser diode 330, a collimator lens 340, a CPU (central processing unit) 350, a driver IC (semiconductor integrated circuit) 360 for driving the laser diode, and a driver IC 370 including a driver circuit for the first piezoelectric mirror that controls the tilt of the first piezoelectric mirror around the rotary shaft X and a driver circuit for the second piezoelectric mirror that controls the tilt of the second piezoelectric mirror around the rotary shaft Y. The driver IC 370 includes a differential amplifier 11 (single-end amplifiers) and an output-signal detector/processor circuit 12 according to an embodiment described above.

Any biaxial piezoelectric mirror may be used, such as that disclosed in Japanese Patent Application Laid-Open Publication No. 2009-15300.

FIG. 11 illustrates the screen 200, which is an associated component. The projector 300 projects an image on the screen 200. The piezoelectric mirror 320 serves as a biaxially driven actuator that tilts a mirror component M around the rotary shafts X and Y.

The laser diode 330 is a light source that emits a laser beam. The laser beam emitted from the laser diode 330 may be diverging light.

The collimator lens 340 converts the diverging light into collimated light. The collimated light may include a P-polarized light component that oscillates in an incident plane of the light and/or an S-polarized light component that oscillates orthogonal to the incident plane.

The collimated light from the collimator lens 340 is incident on the piezoelectric mirror 320 and is reflected at the mirror component M. The piezoelectric mirror 320 tilts the mirror component M around the rotary shafts X and Y to oscillate the reflected laser beam orthogonal to the rotary shafts X and Y. The laser beam reflected at the piezoelectric mirror 320 is reflected at a concave mirror 322 and is incident on the screen 200. The laser beam on the screen 200 can be biaxially scanned in orthogonal directions to form an image.

The CPU 350 controls the laser driver IC 360 to drive the laser diode 330. The CPU 350 controls the piezoelectric mirror driver 370 in response to the image signal input to the projector 300 to control the tilt of the piezoelectric mirror 320 around the rotary shafts X and Y.

The tilt of the piezoelectric mirror 320 shifts the laser beam around the rotary shafts X and Y, and the light reflected at the mirror component M of the piezoelectric mirror 320 scans the screen 200, to project an image on the screen 200.

Two driving modes are known for piezoelectric mirrors: a resonance mode and a non-resonance mode. In the embodiments described above, one of the two driver circuits driving the piezoelectric mirrors may be driven by the resonance mode and the other may be driven by the non-resonance mode. In this case, the resonance mode may involve a capacitive-load driver circuit according to an embodiment described above whereas the non-resonance mode need not involve a capacitive-load driver circuit.

The present invention, which has been conceived by the inventors, should not be limited to the embodiments described in detail above. The driver circuit according to an embodiment includes the comparator 21 for detecting the relative magnitude of the voltages (output voltages) at the terminals VOUTM and VOUTP. Alternatively, a timer circuit may be provided in place of the comparator, to terminate the transfer of charges when a predetermined time elapses after the start of charge transfer al: the charge-transfer circuit. In such a case, the time counted by the timer circuit corresponds to the through rate of the output voltage, for example.

In this embodiment, the current serving as a reference for the current fed to the charge-transfer circuit is proportional to the current fed to the output stage of the differential amplifier (output voltage). Alternatively, a constant-current source that feeds a constant current corresponding to the through rate may be provided, and the current from the constant-current source may be the reference current.

The driver circuit according to this embodiment alternately applies a voltage to the two capacitive loads. Alternatively, the driver circuit may be of a scanning type and sequentially apply a voltage to multiple (three or more) capacitive loads.

The present invention is applied to a projector including a driver circuit according an embodiment described above that drives piezoelectric devices controlling the orientation of mirrors. Alternatively, the present invention may be applied to a digital camera including piezoelectric devices controlling the orientation of image-capturing devices and driver circuits that drive the piezoelectric devices.

INDUSTRIAL APPLICABILITY

The present invention can be widely applied to electronic apparatuses such as optical scanners including capacitive-load driver circuits and capacitive loads of the driver circuits.

DESCRIPTION OF REFERENCE NUMERALS 10 driver circuit (capacitive-load circuit)
11 differential amplifier
11A, 11B output stage of differential amplifier
12 output-signal detector/processor circuit
21 voltage comparator (output-voltage detector circuit)
22 logic circuit
23 constant-current source

The invention claimed is:

1. A capacitive-load driver circuit that is connected to terminals connected to capacitive loads and an output stage of an amplifier for feeding output voltages to the terminals to drive the capacitive loads, the capacitive-load driver circuit temporarily feeding a current during a transition period of the output voltages from one of the terminals transitioning from a high voltage state to a low voltage state to another terminal transitioning from a low voltage state to a high voltage state, the capacitive-load driver circuit comprising:
a current-variation detector circuit that detects a variation in a current at the output stage;
a voltage comparator circuit that determines a magnitude relation of voltages at the terminals; and
a charge transfer circuit that feeds a predetermined current to one of the terminals to transfer charges from a capacitive load connected to a high voltage terminal to a capacitive load connected to a low voltage terminal, wherein the charge transfer circuit feeds the predetermined current to one of the terminals depending on a result detected at the current-variation detector circuit, and wherein the charge transfer circuit starts feeding the predetermined current to one of the terminals upon detection of a variation in the current at the output stage by the current-variation detector circuit, and the charge transfer circuit interrupts the current between the terminals upon detection of inversion of the magnitude relation of the voltages at the terminals by the voltage comparator circuit.

2. The capacitive-load driver circuit according to claim 1, further comprising:
a reference-current generator circuit that generates a reference current proportional to the current output from the output stage,
wherein the charge transfer circuit feeds a current proportional to the reference current generated at the reference-current generator circuit to one of the terminals.

3. The capacitive-load driver circuit according to claim 2, wherein the amplifier comprises a differential amplifier comprising a first output stage and a second output stage and has a differential output,
wherein the reference-current generator circuit comprises:
a first current mirror circuit that feeds a current proportional to a current fed to the first output stage;
a second current mirror circuit that feeds a current proportional to a current fed to the second output stage;
a current selector that selects a current transferred at the first current mirror circuit or a current transferred at the second current mirror circuit; and
a third current mirror circuit that feeds the current selected at the current selector, and
wherein the reference-current generator circuit outputs a current transferred at the third current mirror circuit as the reference current.

4. The capacitive-load driver circuit according to claim 3, wherein the reference-current generator circuit further comprises:
a fourth current mirror circuit that feeds a current proportional to a bias current fed to the first output stage; and
a fifth current mirror circuit that feeds a current proportional to a bias current fed to the second output stage, and
wherein the current selector selects a differential current between the current transferred at the first current mirror circuit and the current transferred at the fourth current mirror circuit or a differential current between the current transferred at the second current mirror circuit and the current transferred at the fifth current mirror circuit.

5. The capacitive-load driver circuit according to claim 4, wherein the current-variation detector circuit comprises:
a sixth current mirror circuit that feeds a current proportional to a current fed to the first output stage;
a seventh current mirror circuit that feeds a current proportional to a current fed to the second output stage;
a first current-voltage converter that converts the current transferred at the sixth current mirror circuit to a voltage;
a second current-voltage converter that converts the current transferred at the seventh current mirror circuit to a voltage; and
a determiner circuit that determines a direction of an output current based on the voltages converted at the first current-voltage converter and the second current-voltage converter, and
wherein the current selector selects a current based on the result determined at the determiner circuit.

6. The capacitive-load driver circuit according to claim 2, wherein the charge transfer circuit comprises:
a first transistor and a second transistor connected in series between a first terminal connected to a first capacitive load and a second terminal connected to a second capacitive load; and
a third transistor that comprises a control terminal connected to control terminals of the first and second transistors and receives the reference current.

7. An optical scanner comprising:
a light source that emits light;
a first piezoelectric device that tilts a first mirror that reflects the light from the light source around a first rotary shaft;
a second piezoelectric device that tilts a second mirror that reflects the light reflected at the first mirror around a second rotary shaft;
a first driver circuit that drives the first piezoelectric device; and
a second driver circuit that drives the second piezoelectric device,
wherein the light reflected at the second mirror is scanned on a screen to form an image, and
wherein at least one of the first driver circuit and the second driver circuit comprises the capacitive-load driver circuit according to claim 1.

8. An optical scanner comprising:
a light source that emits light;
a first piezoelectric device that tilts a mirror that reflects the light from the light source around a first rotary shaft;
a second piezoelectric device that tilts the mirror around a second rotary shaft;
a first driver circuit that drives the first piezoelectric device in response to an image signal; and
a second driver circuit that drives the second piezoelectric device in response to an image signal,
wherein the light reflected at the mirror is scanned on a screen to form an image, and
wherein at least one of the first driver circuit and the second driver circuit comprises the capacitive-load driver circuit according to claim 1.

* * * * *